US011239315B2

(12) United States Patent
Mishra et al.

(10) Patent No.: US 11,239,315 B2
(45) Date of Patent: Feb. 1, 2022

(54) DUAL TRENCH ISOLATION STRUCTURES

(71) Applicant: GLOBALFOUNDRIES U.S. INC., Santa Clara, CA (US)

(72) Inventors: Shiv Kumar Mishra, Mechanicville, NY (US); Baofu Zhu, Clifton Park, NY (US); Arkadiusz Malinowski, Malta, NY (US); Kaushikee Mishra, Malta, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/780,494

(22) Filed: Feb. 3, 2020

(65) Prior Publication Data

US 2021/0242306 A1 Aug. 5, 2021

(51) Int. Cl.
*H01L 29/06* (2006.01)
*H01L 21/26* (2006.01)
*H01L 29/78* (2006.01)
*H01L 29/10* (2006.01)
*H01L 29/66* (2006.01)
*H01L 21/266* (2006.01)
*H01L 21/74* (2006.01)
*H01L 21/762* (2006.01)
*H01L 21/265* (2006.01)

(52) U.S. Cl.
CPC ........ *H01L 29/0653* (2013.01); *H01L 21/266* (2013.01); *H01L 21/26513* (2013.01); *H01L 21/74* (2013.01); *H01L 21/76229* (2013.01); *H01L 29/1083* (2013.01); *H01L 29/1095* (2013.01); *H01L 29/66681* (2013.01); *H01L 29/66795* (2013.01); *H01L 29/7816* (2013.01); *H01L 29/7851* (2013.01)

(58) Field of Classification Search
CPC . H01L 21/26; H01L 21/266; H01L 21/26513; H01L 21/74; H01L 21/76; H01L 21/76229; H01L 29/06; H01L 29/0653; H01L 29/1083; H01L 29/1095; H01L 29/66; H01L 29/66681; H01L 29/66795; H01L 29/78; H01L 29/785; H01L 29/7816; H01L 29/7851
USPC ........................................................ 257/342
See application file for complete search history.

(56) References Cited

U.S. PATENT DOCUMENTS 5,504,033 A   4/1996  Bajor et al.
9,236,269 B2  1/2016  Kozarsky et al.
(Continued)

OTHER PUBLICATIONS

Haynie et al., "Power LDMOS with novel STI profile for improved Rsp, BVdss, and reliability", IEEE, 2010, 4 pages.
(Continued)

*Primary Examiner* — Fazli Erdem
(74) *Attorney, Agent, or Firm* — David Cain; Andrew M. Calderon; Roberts Calderon Safran & Cole, P.C.

(57) ABSTRACT

The present disclosure generally relates to semiconductor structures and, more particularly, to dual trench isolation structures and methods of manufacture. The structure includes: a doped well region in a substrate; a dual trench isolation region within the doped well region, the dual trench isolation region comprising a first isolation region of a first depth and a second isolation region of a second depth, different than the first depth; and a gate structure on the substrate and extending over a portion of the dual trench isolation region.

20 Claims, 3 Drawing Sheets

(56) References Cited

U.S. PATENT DOCUMENTS

| | | |
|---|---|---|
| 9,419,082 B2 | 8/2016 | Mishra et al. |
| 10,084,093 B1 | 9/2018 | Mishra et al. |
| 10,236,367 B2 | 3/2019 | Singh et al. |
| 10,290,712 B1 | 5/2019 | Caviatti et al. |
| 10,453,747 B2 | 10/2019 | Kumar et al. |
| 2007/0054464 A1* | 3/2007 | Zhang ............ H01L 21/823481 438/424 |
| 2015/0076555 A1* | 3/2015 | Yang ................ H01L 29/66325 257/141 |
| 2015/0097236 A1* | 4/2015 | Tsai .................... H01L 29/7816 257/339 |
| 2016/0111488 A1* | 4/2016 | Lu ....................... H01L 29/0653 257/330 |
| 2016/0372360 A1* | 12/2016 | Fang ................. H01L 21/76229 |
| 2018/0204929 A1 | 7/2018 | Mishra et al. |
| 2019/0013402 A1 | 1/2019 | Singh et al. |

OTHER PUBLICATIONS

Malinowski et al., "What is Killing Moore's Law? Challenges in Advanced FintET Technology Integration", 2019 MIXDES—26th International Conference "Mixed Design of Integrated Circuits and Systems", 48 pages.

Chahar et al., "The Effect of Shallow Trench Isolation and Sinker on the Performance of Dual-Gate LDMOS Device", IEEE, vol. 66, Issue 1, Jan. 2019, 7 pages.

\* cited by examiner

DUAL TRENCH ISOLATION STRUCTURES

FIELD OF THE INVENTION

The present disclosure generally relates to semiconductor structures and, more particularly, to dual trench isolation structures and methods of manufacture.

BACKGROUND

LDMOS (laterally-diffused metal-oxide semiconductor) is a double diffused MOSFET (metal-oxide-semiconductor field-effect transistor) used in microwave/RF power amplifiers as well as audio power amplifiers. By way of example, LDMOS devices are used in RF power amplifiers for base-stations as the requirement is for high output power with a corresponding drain to source breakdown voltage. Compared to other devices, LDMOS shows a lower maximum power gain frequency.

For performance, LDMOS transistors require lower levels of resistance (Ron), while also requiring higher levels for a drain-source-saturated breakdown voltage ($BV_{DSS}$). It should be understood that Ron is the output resistance of a power switching device when it is forward biased to the fully "on" or conducting state. The Ron is especially important in high-current switches, where the voltage drop across the power device must be minimized. Known attempts to reduce Ron levels by implementing higher implant dose in the N-well and increasing conductivity will degrade the breakdown voltage, $BV_{DSS}$, of the LDMOS transistor.

SUMMARY

In an aspect of the disclosure, a structure comprises: a doped well region in a substrate; a dual trench isolation region within the doped well region, the dual trench isolation region comprising a first isolation region of a first depth and a second isolation region of a second depth, different than the first depth; and a gate structure on the substrate and extending over a portion of the dual trench isolation region.

In an aspect of the disclosure, a structure comprises: a first well region in a substrate; a second well region in the substrate; a dual trench isolation region in the first well region, the dual trench isolation region composed of a shallow trench isolation structure and a deep trench isolation structure on a side adjacent to and connecting with the shallow trench isolation structure; and a gate structure spanning over the first well region and the second well region, the gate structure extending to the dual trench isolation region.

In an aspect of the disclosure, a method comprises: forming a doped well region in a substrate; forming a dual trench isolation region within the doped well region, the dual trench isolation region comprising a first isolation region of a first depth and a second isolation region of a second depth, different than the first depth; and forming a gate structure on the substrate and extending over a portion of the dual trench isolation region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to dual trench isolation structures and methods of manufacture. In embodiments, the dual trench isolation structures are composed of a shallow trench isolation structure immediately adjacent to a side and connecting with a deep trench isolation structure, forming a stepped isolation structure. The structures disclosed herein, i.e., dual trench isolation structure, are used in a laterally diffused metal-oxide semiconductor (LDMOS) transistor. Advantageously, by forming a dual trench isolation structure in the LDMOS transistor, performance can be improved due to reduced resistance (Ron) levels and preservation of a drain-source-saturated breakdown voltage ($BV_{DSS}$).

The structures and processes described herein include fin formation and a single diffusion break fin cut used in the formation of a deep trench isolation structure in an LDMOS transistor. In embodiments, the dual trench isolation structure is formed within the LDMOS transistor, by removing select fin structures and preserving other fin structures. More specifically, the dual trench isolation structure is a stepped structure, which can be formed, partly, by removing neighboring fins and etching into the substrate, itself. This will result in defining both a shallow trench isolation region and a deep trench isolation region, resulting in the formation of a stepped dual trench isolation structure.

Accordingly, a unique LDMOS structure is formed with a reduced Ron resistance, a higher current (Idlin) at a given voltage drain Vdd and leakage, with no degradation of a breakdown voltage $BV_{DSS}$ of device. That is, the structure disclosed herein reduces Ron and hence improves device performance without compromising $BV_{DSS}$ (break down voltage). In embodiments, Idlin can be improved by about 14% and Ron can be reduced by about 8%.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
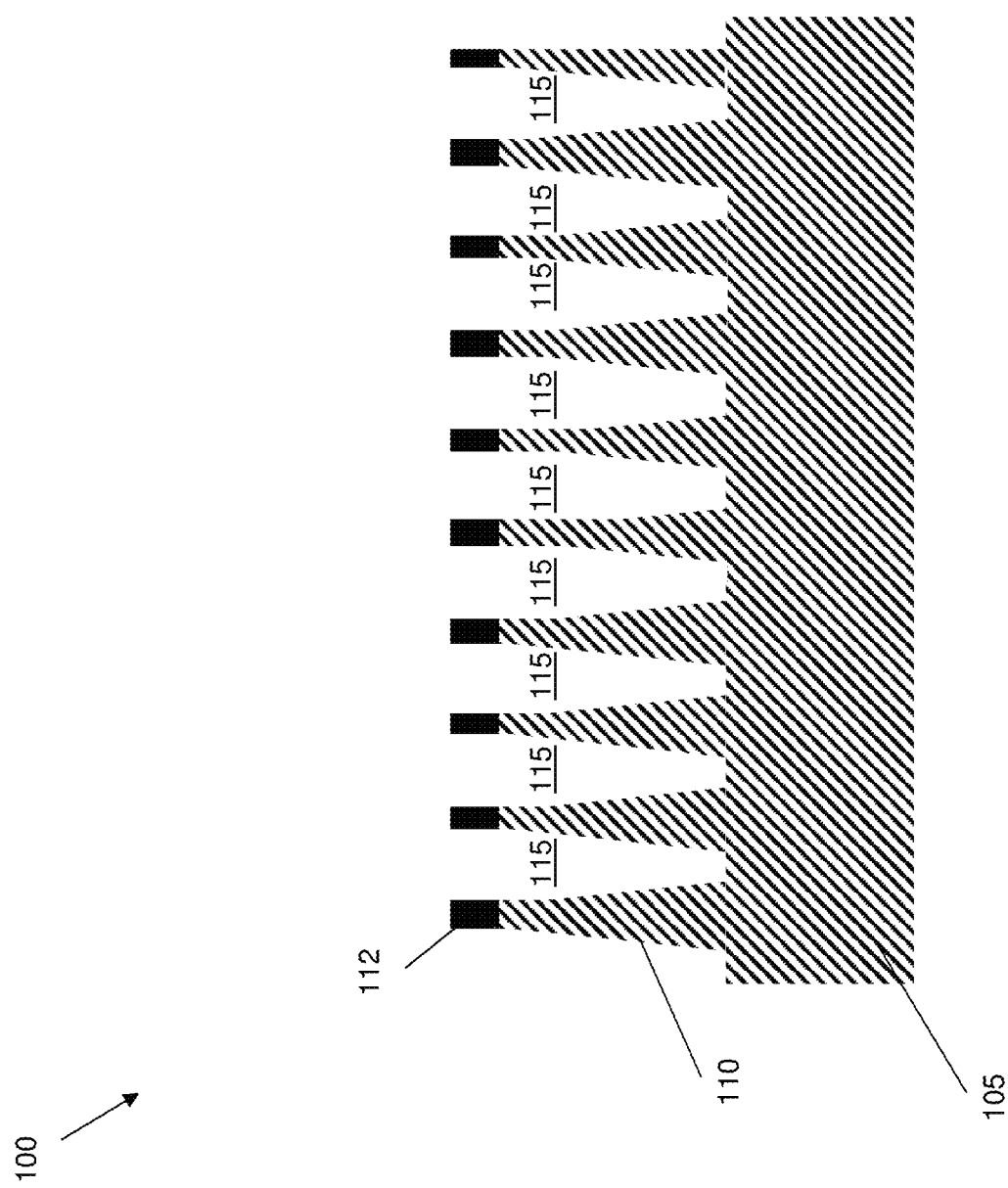
FIG. 1 shows fin structures, amongst other features, in accordance with aspects of the present disclosure.

FIG. 1 shows fin structures in accordance with aspects of the present disclosure. In embodiments, the structure 100 of FIG. 1 includes fin structures 110 composed of a substrate material 105. The fin structures 110 will be the active area of the devices. The substrate 105 can be a slightly doped p-substrate, as is known to those of skill in the art. In more specific examples, the substrate 105 may be composed of any suitable substrate material including, but not limited to, Si, SiGe, SiGeC, SiC, GaAs, InAs, InP, etc. Shallow isolation regions 115, e.g., shallow trench isolation structures, are formed between the fin structures 110. The fin structures 110 may be formed from a single fin finger that is divided into separate sections by a cut formed as one of the shallow isolation trenches 115. The fin structures 110 also include a capping material 112, e.g., nitride material, which will be removed in later processes.

The fin structures 110 can be fabricated using conventional lithography and etching techniques including a sidewall image transfer (SIT) technique or self-aligned double patterning (SADP) in which shallow trenches are etched into the substrate. In an example of a SIT technique, a mandrel material, e.g., $SiO_2$, is deposited on the substrate 105 using conventional chemical vapor deposition (CVD) processes. A resist is formed on the mandrel material and exposed to light to form a pattern (openings). A reactive ion etching is performed through the openings to form the mandrels. In embodiments, the mandrels can have different widths and/or spacing depending on the desired dimensions of the fin structures 110. The mandrels are then covered with a deposition layer, which is etched to form spacers on the sidewalls of the mandrels which are preferably material that is different than the mandrels, and which are formed using conventional deposition processes known to those of skill in the art. The spacers can have a width which matches the dimensions of the fin structures 110, for example. The mandrels are removed or stripped using a conventional etching process, selective to the mandrel material. An etching is then performed within the spacing of the spacers to form the sub-lithographic features, e.g., fin structures 110. The sidewall spacers can then be stripped. In embodiments, the width of each fin structure can be different dimensions depending on the design parameters. Any residual masking material can be removed by a chemical mechanical process (CMP), stopping on the capping material 112.

Figure 2:
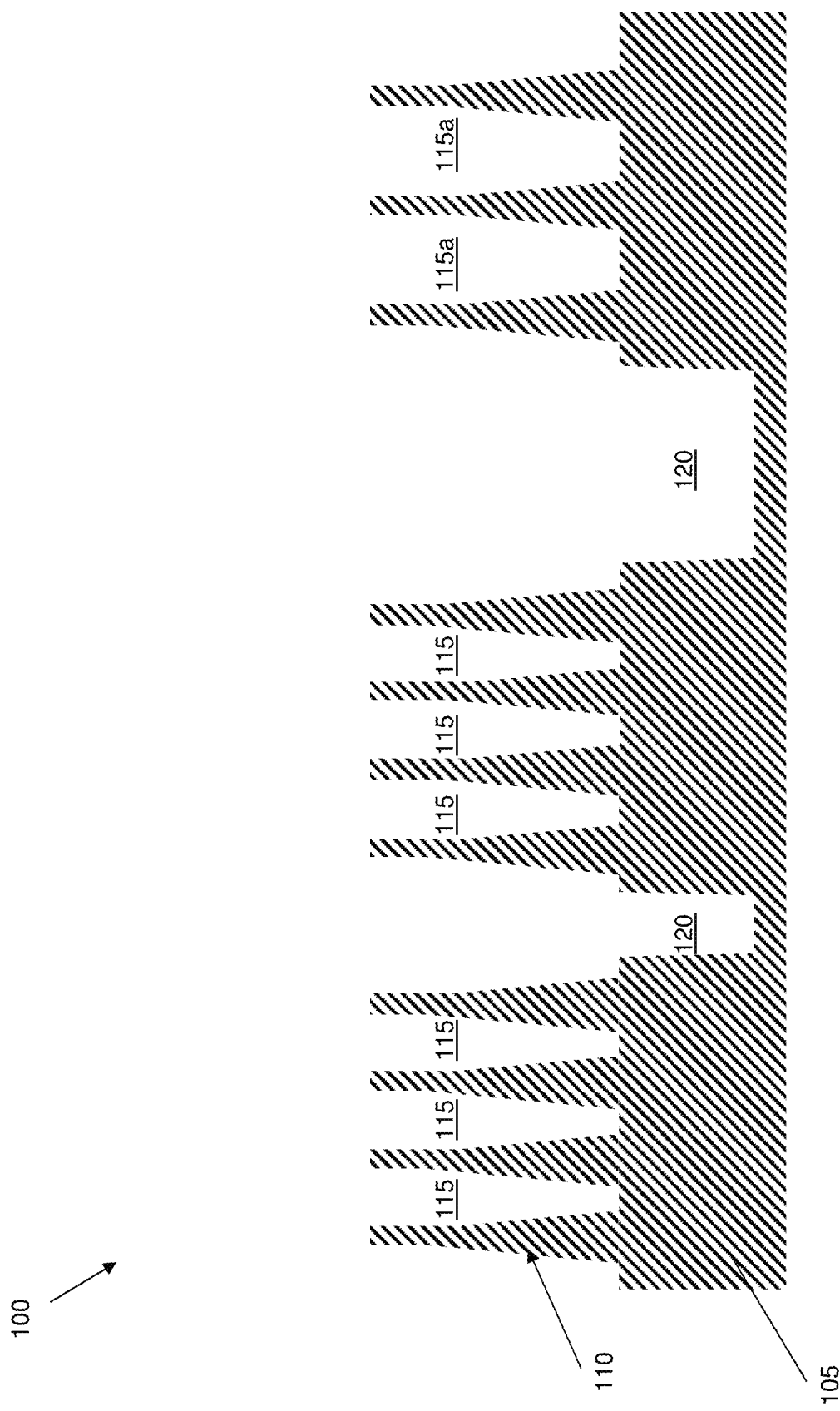
FIG. 2 shows deep trenches, amongst other features, in accordance with aspects of the present disclosure.

FIG. 2 shows deep trenches 120 formed between fin structures 110 in accordance with aspects of the present disclosure. In embodiments, the deep trenches 120 are formed by the removal of selected fin structures and a further etching into the underlying substrate 105. The deep trenches 120 are directly adjacent and connecting to selected shallow trenches 115, forming a stepped structure. The deep trenches 120 are not interposed directly over or on the shallow trenches 115; instead, they are adjacent to and in direct contact with the shallow trench isolation structures. In embodiments, the deep trenches 120 are formed along a longitudinal axis of the fin structures 110, which can include within the fin cuts.

In forming the deep trenches 120, a hardmask is formed over the fin structures 110, which is patterned and etched to expose neighboring fin structures 110 (near an opening in the Rx layer) that are to be removed in later processes. It should be understood by those of ordinary skill in the art that the Rx layer is the active layer where doping takes place to form source and drain regions, for example. The masking material will also protect, i.e., preserve, any of the fin structures 110 that are to remain with the device. In embodiments, the masking material comprises, as an illustrative and non-limiting example, a layering of different materials, e.g., SOH, SiON, a bottom anti-reflective coating (BARC) and resist material. In the lithography step, in embodiments, the resist material is exposed to energy (e.g., light), which forms an opening aligned with selected fin structures which are to be removed (or cut) in later processing steps.

Still referring to FIG. 2, after the lithography step, etching processes are used to remove exposed underlying masking material, e.g., SOH, SiON and BARC, also aligned with the selected fin structures which are to be removed in later processing steps. After removal of the masking materials, which exposes the capping material 112 of fin structures which are to be removed, the etching process continues with the removal of the exposed capping material, followed by the exposed fin structures. Thereafter, a deep trench 120 is formed into the underlying substrate 105 through a continued etching process, e.g., reactive ion etching (RIE), with selective chemistries to the substrate material 105. After formation of the deep trenches 120, the remaining masking material can be removed with a selective etch chemistry, followed by removal of the nitride capping material on the remaining fin structures.

By removal of the fin structures, the deep trenches 120 can be wider than the shallow trenches 115. In addition, it is contemplated that the shallow trenches 115 can have a depth of about 100 nm to about 150 nm; whereas, the deep trenches 120 can have a depth of about 200 nm to about 300 nm. It is understood, though, that the trenches 115, 120 can have other dimensions depending on the technology node and desired performance parameters.

Figure 3:
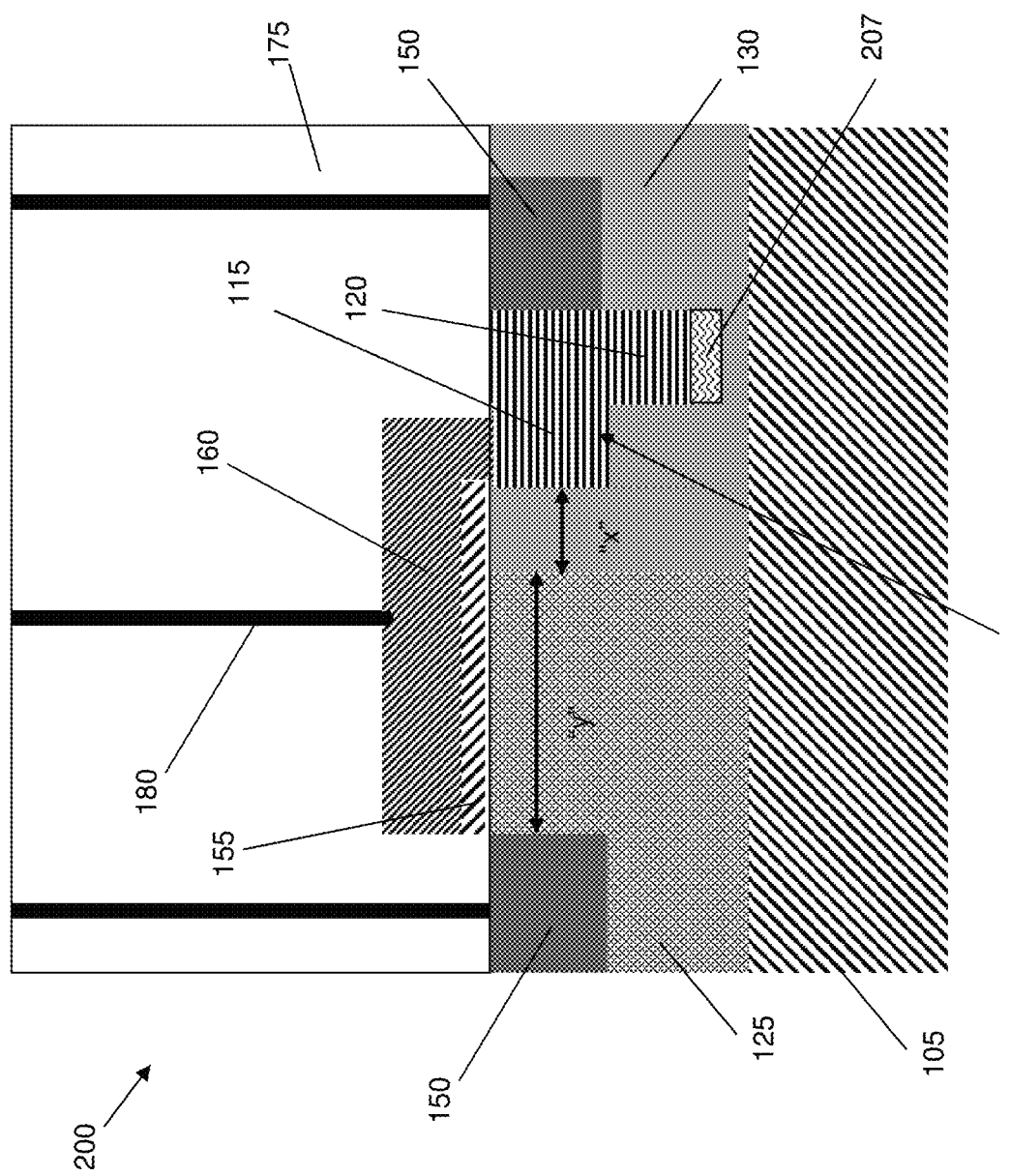
FIG. 3 shows a laterally-diffused metal-oxide semiconductor (LDMOS) transistor, with a dual trench isolation structure, amongst other features, in accordance with aspects of the present disclosure.

FIG. 3 shows a laterally-diffused metal-oxide semiconductor (LDMOS) transistor 200 with the dual trench isolation structure 205 formed by the trenches 115, 120, amongst other features, in accordance with aspects of the present disclosure. A top surface of the dual isolation structure 205 may be coplanar with a top surface of the fin structures, and the total depth of the dual isolation structure 205 is comprised of the deep trench 120. This is due to the fact that the deep trench 120 is adjacent to and not interposed (e.g., coincidence with) directly over or on the shallow trenches 115.

In embodiments, the LDMOS transistor 200 includes a P-well 125 and an N-well 130 formed in the substrate 105 and more specifically within the active fin structures 110. The P-well 125 and an N-well 130 are formed by conventional ion implantation processes (or diffusion processes) using different masking and ion implantation (dopants) processes known to this of skill in the art such that no further explanation is required for a complete understanding of the invention. For example, the wells 125, 130 may be formed by introducing a concentration of a different dopant of opposite conductivity type in the substrate and fin structure, with different masking steps. The P-well 125 is doped with p-type dopants, e.g., Boron (B), and the N-well 130 is doped with n-type dopants, e.g., Arsenic (As), Phosphorus (P) and Sb, among other suitable examples. In embodiments, the N-well 130 is formed on a drain side of the device; whereas, the P-well 125 is formed on a source side of the device.

The dual trench isolation structure 205 is formed in the N-well 130, which is a combination of the deep trenches 120 and adjacent shallow trenches 115 filled with an insulator material. Prior to filling the deep trenches 120 and adjacent shallow trenches 115 with insulator material, a bottom of the deep trench 120 can be subjected to an additional diffusion process, e.g., ion implantation process with an N-type dopant, to form an additional implant region 207 to improve Ron. In embodiments, the concentration of the ion implantation of the implant region 207 is higher than in the N-well 130 so that it further reduces resistance of the current path. The insulator material can be deposited within the dual trench isolation structure 205 by depositing an oxide material between the fin structures 110 and within the trenches 115, 120. The deposition of the insulator material in the trenches 115, 120 will form a stepped isolation feature (e.g., the dual trench isolation structure 205) within the drain region, e.g., N-well 130, of the active region. In embodiments, the oxide material can be a TEOS (Tetraethyl orthosilicate) or deposited by a high aspect ratio process (HARP) chemical vapor deposition (CVD) process or combinations thereof, followed by a CMP process to remove any excess oxide material.

In embodiments, the dual trench isolation structure 205 will be confined exclusively within the N-well 130, i.e., will not extend beyond a lower portion of the N-well 130. Also, as should be recognized by those of skill in the art, the N-well 130 will be on the drain side of the device and the P-well 125 will be on the source side of the device. On the drain side, a distance "x" is provided between the edge of the dual trench isolation structure 205 and the junction between the P-well 125 and the N-well 130. On the other hand, a distance "y" is provided in the P-well 125 (extending on the source side of the device). It should be understood by those of skill in the art that the distance "x" is representative of a drift region on a drain side of the device; whereas, the distance "y" in the P-well 125 is representative of the channel length. In embodiments, "x"<"y", with different "x" and "y" dimensions contemplated herein depending on required device performance and technology node as should be understood by those of ordinary skill in the art such that no further explanation is required for a complete understanding of the invention.

The dual isolation structure 205 provides many advantages for the LDMOS transistor 200. For example, by implementing the dual isolation structure 205, electrons will flow under the deep trench portion 120, effectively shortening the electron path without impacting breakdown voltage. More specifically, by implementing the dual isolation structure 205, the advantages include reduced levels of resistance (Ron) by as much as about 8%, thereby improving device performance. As should be understood, the implants/dopants of the N-well 130 extending below the dual isolation structure 205 will also further reduce Ron levels. Decreasing the levels of Ron also allows for an increase in the current (Idlin) at given drain voltage (Vdd) and leakage, further improving device performance. The dual isolation structure 205 also protects against degradation of a drain-source-saturated breakdown voltage ($BV_{DSS}$) of the LDMOS transistor 200. Additionally, the processes and structures described herein are formed with no extra masking steps, which further streamlines fabrication of the LDMOS transistor 200.

Continuing with FIG. 3, a gate dielectric material 155 is deposited and patterned over the P-well 125 and the N-well 130 using conventional deposition, lithography and etching processes as described herein. For example, the gate dielectric material 155 can be deposited by an atomic layer deposition (ALD) process, for example. The gate dielectric material 155 can be a high-k dielectric, e.g., $HF_2O_2$, which extends to an edge of the dual isolation structure 205. A gate structure 160 is formed over the gate dielectric material 155 using conventional deposition and patterning processes as described herein. In embodiments, the gate structure 160 can be a poly material formed by a gate first process or a replacement gate process, as is known in the art such that no further explanation is needed. The gate structure 160 is formed on the gate dielectric 155 material and extends to and is directly contacting an upper surface of the dual isolation structure 205.

Still referring to FIG. 3, contact regions 150 are formed in the N-well 130 and the P-well 120 by a doping or ion implantation process as is known in the art such that no further explanation is required herein for a complete understanding of the present disclosure. In embodiments, the contact regions 150 can be N+ contact regions separated from the gate structure 160 by the dual isolation structure 205. The contact 150 on the drain side is directly adjacent and contacting the dual trench isolation structure 205, e.g., deep trench portion of the dual trench isolation structure 205. In this way, there is no extended fin region on the drain side, which would separate the contact 150 from the dual isolation structure 205.

After the formation of the contact regions 150, a silicide is deposited over the N+ contacts 150 and, if necessary, the gate structure 160, which is then subjected to a silicide process. The silicide can be deposited using physical vapor deposition (PVD) or CVD processes. In embodiments, the silicide can be a transition metal such as Titanium (Ti), Nickel (Ni), cobalt (Co), tungsten (W) or Ruthenium (Ru), for example, or any alloy of example materials. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device.

Still referring to FIG. 3, an insulator material 175 is deposited over the structures, e.g., contacts 150 and gate structure 160. In embodiments, the insulator material 175 is an interlevel dielectric material such as an oxide material deposited by conventional deposition methods, e.g., CVD. The insulator material 175 is then subjected to lithography and etching processes to form trenches or openings aligned with and exposing the contacts 150 and the gate structure 160. A metal material is deposited within the openings to form contacts 180 on the silicide regions and gate structure 160. The metal contacts 180 can be aluminum; although other metal materials are contemplated herein, including lining materials to prevent electromigration as should be understood by those of skill in the art such that no further explanation is required to understand the present disclosure. Any excessive metal material on a surface of the interlevel dielectric material 175 can be removed by conventional CMP processes.

The LDMOS structures described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a doped well region in a substrate;
a dual trench isolation region within the doped well region, the dual trench isolation region comprising a first isolation region of a first depth and a second isolation region of a second depth, different than the first depth; and
a gate structure on the substrate and extending over a portion of the dual trench isolation region,
wherein the gate structure comprises a gate dielectric material extending to the first isolation region and gate electrode material, the gate electrode material directly contacts an upper surface of the first isolation region, covers the gate dielectric material, and overlaps an edge of the gate dielectric material that extends to the first isolation region.

2. The structure of claim 1, wherein the first isolation region and the second isolation region are adjacent to one another, side-by-side, and connected together in the doped well region.

3. The structure of claim 2, wherein the first isolation region and the second isolation region are provided in a stepped configuration.

4. The structure of claim 2, wherein the dual trench isolation region is exclusively within the doped well region.

5. The structure of claim 4, wherein the first depth is shallower than the second depth, and the gate structure is adjacent to the first depth, with the gate dielectric material of the gate structure extending to an edge of the first isolation region.

6. The structure of claim 5, further comprising a drift region defined under the dielectric material and located between the first isolation region and a junction to another doped well region.

7. The structure of claim 6, further comprising a contact on an opposing side and contacting the dual trench isolation region, from the drift region.

8. The structure of claim 7, wherein the substrate is a fin structure which includes the doped well region and the other doped well region, the doped well region is an N-well and the other doped well region is a P-well.

9. The structure of claim 8, further comprising an additional dopant region underneath the dual trench isolation region.

10. The structure of claim 1, further comprising a contact to a drain region of the gate structure and a contact to a source region of the gate structure, the contact to the drain region of the gate structure is directly adjacent and contacting the second isolation region of the dual trench isolation region.

11. A structure, comprising:
a first well region in a substrate;
a second well region in the substrate;
a dual trench isolation region in the first well region, the dual trench isolation region composed of a shallow trench isolation structure and a deep trench isolation structure on a side adjacent to and connecting with the shallow trench isolation structure; and
a gate structure spanning over the first well region and the second well region, the gate structure extending to the shallow trench isolation structure of the dual trench isolation region, wherein a gate dielectric material of the gate structure extends to an edge of the shallow trench isolation structure and a gate electrode material of the gate structure directly contacts an upper surface of the shallow trench isolation structure, directly contacts an upper surface and covers the gate dielectric material, and overlaps beyond an edge of the shallow trench isolation structure and the gate dielectric material.

12. The structure of claim 11, wherein the deep trench isolation structure is deeper than the shallow trench isolation structure thereby forming a stepped feature within the first well region.

13. The structure of claim 11, wherein the first well region is a N-well region and the second well region is a P-well region and an edge of the shallow trench isolation structure to the P-well region defines a drift region of the gate structure.

14. The structure of claim 13, wherein the substrate is an active fin structure and the gate structure is formed on the fin structure.

15. The structure of claim 14, further comprising an additional doped region within the first well structure and under the deep trench isolation structure of the dual trench isolation region.

16. The structure of claim 15, further comprising a contact in the first well region and adjacent to and contacting the deep trench isolation structure of the dual trench isolation region.

17. The structure of claim 11, wherein the gate structure extends over the shallow trench isolation structure of the dual trench isolation region.

18. The structure of claim 17, wherein the dual trench isolation region is exclusively within the first well region.

19. The structure of claim 11, wherein a total depth of the dual trench isolation structure is based on the deep trench isolation structure.

20. A method, comprising:
forming a doped well region in a substrate;
forming a dual trench isolation region within the doped well region, the dual trench isolation region comprising a first isolation region of a first depth and a second isolation region of a second depth, different than the first depth; and
forming a gate structure on the substrate and extending over a portion of the dual trench isolation region,
wherein the gate structure comprising forming a gate dielectric material to an edge of the first isolation region and a gate electrode material directly contacting an upper surface of the first isolation region, the gate electrode material covering the gate dielectric material and overlapping an edge of the gate dielectric material that extends to the first isolation region.

* * * * *